US009824745B1

United States Patent
Lee (10) Patent No.: US 9,824,745 B1
(45) Date of Patent: Nov. 21, 2017

(54) REFRESH TIME DETECTION CIRCUIT AND SEMICONDUCTOR DEVICE INCLUDING THE SAME

(71) Applicant: SK hynix Inc., Icheon-si, Gyeonggi-do (KR)

(72) Inventor: Hyeng Ouk Lee, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/455,815

(22) Filed: Mar. 10, 2017

(30) Foreign Application Priority Data

Oct. 20, 2016 (KR) ........................ 10-2016-0136448

(51) Int. Cl.
*G11C 29/50* (2006.01)
*G11C 11/4078* (2006.01)
*G11C 11/4072* (2006.01)
*G11C 11/403* (2006.01)
*G11C 29/26* (2006.01)
*G11C 29/12* (2006.01)
*G11C 29/04* (2006.01)

(52) U.S. Cl.
CPC ........ *G11C 11/4078* (2013.01); *G11C 11/403* (2013.01); *G11C 11/4072* (2013.01); *G11C 29/12015* (2013.01); *G11C 29/26* (2013.01); *G11C 2029/0403* (2013.01); *G11C 2211/406* (2013.01)

(58) Field of Classification Search
CPC ............. G11C 11/4078; G11C 11/403; G11C 11/4072; G11C 29/12015; G11C 29/26; G11C 2211/406; G11C 2029/0403

USPC ........................................................ 365/201
See application file for complete search history.

(56) References Cited

U.S. PATENT DOCUMENTS

| 6,898,138 | B2 * | 5/2005 | Meyer ............... | G11C 11/40626 365/149 |
|---|---|---|---|---|
| 7,120,073 | B2 * | 10/2006 | Meyer ............... | G11C 11/40626 365/149 |
| 7,372,752 | B2 | 5/2008 | Oh | |
| 7,872,930 | B2 | 1/2011 | Chen et al. | |
| 2004/0042306 | A1 * | 3/2004 | Meyer ............... | G11C 11/40626 365/211 |

* cited by examiner

*Primary Examiner* — Han Yang
*Assistant Examiner* — Xiaochun L Chen
(74) *Attorney, Agent, or Firm* — William Park & Associates Ltd.

(57) ABSTRACT

A refresh time detection circuit and a semiconductor device including the same may be provided. The refresh time detection circuit may include a code generator configured to generate a code signal for detecting a refresh time. The refresh time detection circuit may include a latch circuit configured to generate a latch signal by latching the code signal according to a fail signal, and generate a pre-code signal and a post-code signal by latching each latch signal according to a pre-enable signal and a post-enable signal. The refresh time detection circuit may include a subtractor configured to output a refresh detection signal by performing subtraction between the pre-code signal and the post-code signal. The refresh time detection circuit may include a comparator configured to generate a detection signal by comparing the refresh detection signal with an offset signal based on the post-enable signal.

20 Claims, 5 Drawing Sheets

REFRESH TIME DETECTION CIRCUIT AND SEMICONDUCTOR DEVICE INCLUDING THE SAME

CROSS-REFERENCE TO RELATED APPLICATION

This application claims priority based upon Korean patent application No. 10-2016-0136448, filed on Oct. 20, 2016, the disclosure of which is hereby incorporated in its entirety by reference herein.

BACKGROUND

1. Technical Field

Embodiments of the present disclosure may generally relate to a refresh time detection circuit and a semiconductor device including the same, and more particularly to a technology for testing refresh characteristics according to a stress temperature condition.

2. Related Art

Generally, test methods may be classified into a product test and a proving method. The product test may detect defective or failed parts in a manufacturing procedure including a wafer process, an assembly process, etc. The product test removes (or screens) the detected defective or failed parts, resulting in selection of only normal products. In addition, the product test may confirm whether functions or performances of the DRAMs are identical to the predetermined design characteristics.

Therefore, the product test is applied to a large amount of products in a manufacturing process, and needs to be carried out with high productivity (or high throughput). The proving test must be very carefully carried out in a research and development (R&D) process to increase a high degree of completion as well as to reduce a development period.

If defective or failed parts are discovered in the manufacturing process through the above-mentioned tests or if a difference or inconsistency between the design and the function is detected through the above-mentioned tests, the analysis or failure detection method is used to investigate why the defective or failed parts were discovered. Specifically, a method for investigating the correct position of the defective or failed parts generated in DRAMs is of importance.

Generally, as a representative example of the functional tests, a semiconductor chip is first packaged and a burn-in test is then applied to the semiconductor chip. In order to discover defective or failed parts of DRAMs at an early stage, a voltage and a peripheral temperature to be applied to all DRAMs during the burn-in test must have a higher condition (or a higher stress) than the actual usage condition.

As a result, the defective or failed cells discovered by the above-mentioned tests are replaced with redundant cells to normally operate the semiconductor device. In addition, the operational condition arbitrarily established by experimental data is applied to a plurality of pass cells (available cells) through the above-mentioned tests, such that DRAMs can operate.

SUMMARY

In accordance with an embodiment of the present disclosure, a refresh time detection circuit may be provided. The refresh time detection circuit may include a code generator configured to generate a code signal for detecting a refresh time. The refresh time detection circuit may include a latch circuit configured to generate a latch signal by latching the code signal according to a fail signal, and generate a pre-code signal and a post-code signal by latching each latch signal according to a pre-enable signal and a post-enable signal. The refresh time detection circuit may include a subtractor configured to output a refresh detection signal by performing subtraction between the pre-code signal and the post-code signal. The refresh time detection circuit may include a comparator configured to generate a detection signal by comparing the refresh detection signal with an offset signal based on the post-enable signal.

In accordance with an embodiment of the present disclosure, a semiconductor device may be provided. The semiconductor device may include a first input buffer configured to buffer a command signal received from an external test device. The semiconductor may include a refresh time detection circuit configured to latch a code signal corresponding to an output signal of the first input buffer according to a fail signal, a pre-enable signal, and a post-enable signal, generate a pre-code signal and a post-code signal activated at different times, and output a detection signal by comparing a refresh detection signal obtained by subtraction between the pre-code signal and the post-code signal with an offset signal. The semiconductor may include an output buffer configured to buffer the detection signal, and output the buffered detection signal to the external test device.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts.

Various embodiments of the present disclosure may be directed to providing a refresh time detection circuit and a semiconductor device including the same that substantially obviate one or more problems due to limitations and disadvantages of the related art.

The embodiment of the present disclosure may relate to a refresh time detection circuit and a semiconductor device including the same, which can detect a refresh time variation according to a stress temperature condition to detect a suitable stress temperature point.

It is to be understood that both the foregoing general description and the following detailed description of the present disclosure are exemplary and explanatory and are intended to provide further explanation.

Figure 1:
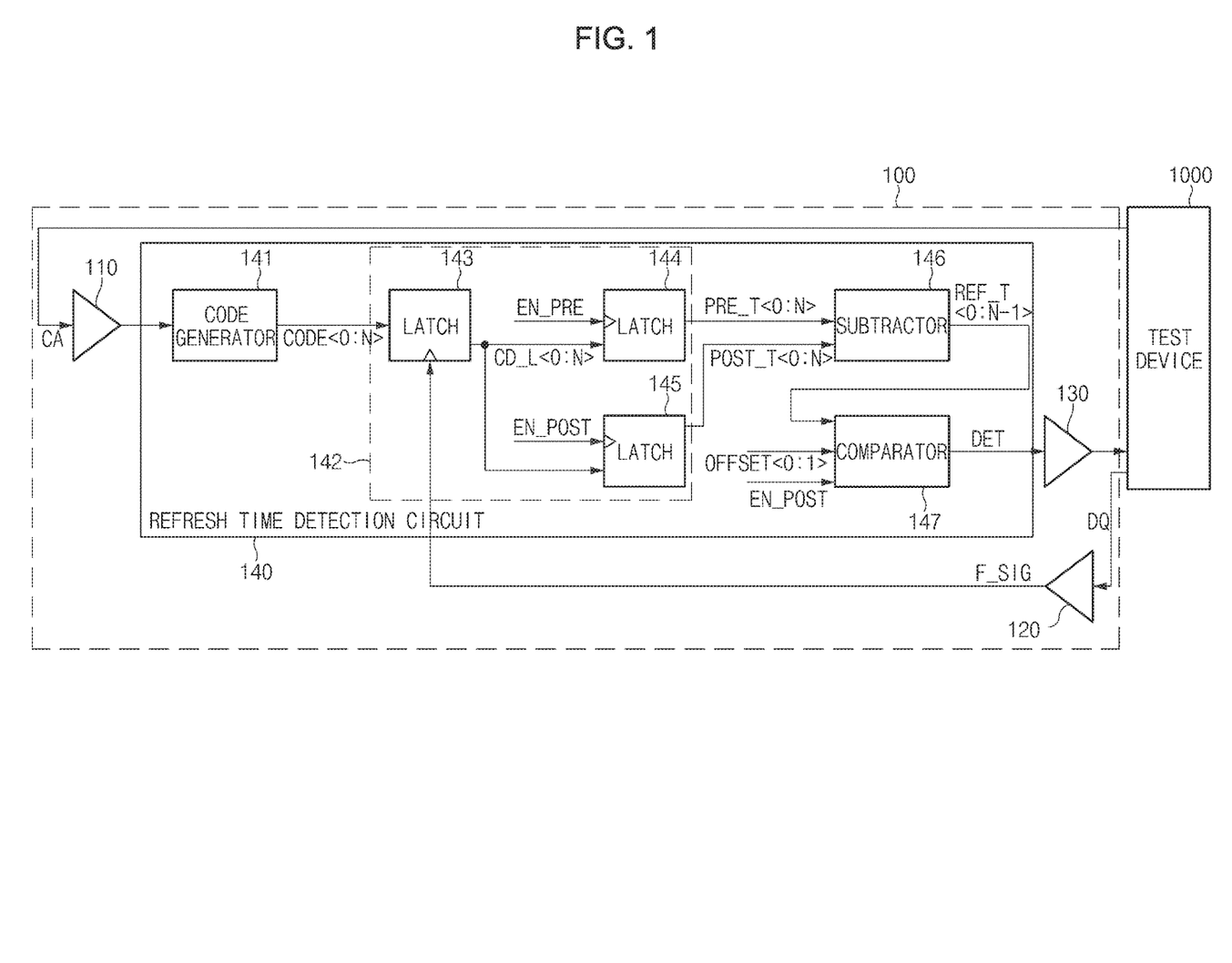
FIG. 1 is a block diagram illustrating a representation of an example of a semiconductor device including a refresh time detection circuit according to an embodiment of the present disclosure.

FIG. 1 is a block diagram illustrating a representation of an example of a semiconductor device including a refresh time detection circuit according to an embodiment of the present disclosure.

Referring to FIG. 1, the semiconductor device 100 may include a plurality of input buffers (110, 120), an output buffer 130, and a refresh time detection circuit 140.

The input buffer 110 may buffer a command signal (CA) received from an external test device 1000, and may output the buffered command signal (CA) to a refresh time detection circuit 140. For example, the external test device 1000 may measure a refresh time (tREF) of the semiconductor device 100 while simultaneously changing a temperature stress condition during the test mode. The command signal (CA) may include temperature stress information measured by the test device 1000. The command signal (CA) may be applied to the input buffer 110 through a command pin (or an address pin) of the semiconductor device 100.

The input buffer 120 may buffer the signal received from the external test device 1000, and may output a fail signal (F_SIG) to a refresh time detection circuit 140. The output buffer 130 may buffer a detection signal (DET) generated from the refresh time detection circuit 140, and may output the buffered detection signal (DET) to the external test device 1000. The fail signal (F_SIG) may be applied to the refresh time detection circuit 140 through a data (DQ) pin of the semiconductor device 100.

The fail signal (F_SIG) may include specific information in which refresh data is kept or lost, while simultaneously changing a refresh time (tREF) in the test device 100. For example, if refresh data remains unchanged, the fail signal (F_SIG) having a logic low level may be applied to a latch 143. In contrast, if refresh data is damaged or lost, the fail signal (F_SIG) having a logic high level may be applied to the latch 143. In an embodiment, the fail signal (F_SIG) may include specific information in which refresh data is maintained or lost when the refresh time is changed. Further, the logic levels of the signals may be different from or the opposite of those described. For example, a signal described as having a logic "high" level may alternatively have a logic "low" level, and a signal described as having a logic "low" level may alternatively have a logic "high" level.

The refresh time detection circuit 140 may include a code generator 141, a latch circuit 142, a subtractor 146, and a comparator 147. The latch circuit 142 may include a plurality of latches 143~145.

The code generator 141 may generate a code signal CODE<0:N> in response to an output signal of the input buffer 110. For example, the code generator 141 may convert the output signal of the input buffer 110 into the code signal (CODE<0:N>). The code generator 141 may sequentially increase the code signal (CODE<0:N>) in response to the output signal of the input buffer 110.

The latch 143 may latch the code signal (CODE<0:N>) in response to the fail signal (F_SIG), and may output a latch signal (CD_L<0:N>). The latch 143 may determine the code signal (CODE<0:N>) received at an activation time of the fail signal (F_SIG) to be the refresh time (tREF), may latch the determined result, and may output the latch signal (CD_L<0:N>). In an embodiment, the latch 143 may be configured to latch the code signal (CODE<0:N>) by synchronizing with the fail signal (F_SIG), and generate the latch signal (CD_L<0:N>).

The latch 144 may latch the latch signal CD_L<0:N> in response to a pre-enable signal (EN_PRE), and may output a pre-code signal (PRE_T<0:N>). In this case, after lapse of a predetermined delay time after activation of the fail signal (F_SIG), the pre-enable signal (EN_PRE) may be activated.

The latch 145 may latch the latch signal (CD_L<0:N>) in response to a post-enable signal (EN_POST), and may output a post-code signal (POST_T<0:N>). In this case, the post-enable signal (EN_POST) may be activated by synchronizing with the fail signal (F_SIG).

The subtractor 146 may perform subtraction between the pre-code signal (PRE_T<0:N>) and the post-code signal (POST_T<0:N>), and thus output a refresh detection signal (REF_T<0:N−1>). In other words, the subtractor 146 may subtract the post-code signal (POST_T<0:N>) from the pre-code signal (PRE_T<0:N>), and thus output the refresh detection signal (REF_T<0:N−1>).

The comparator 147 may compare the refresh detection signal (REF_T<0:N−1>) with the offset signal (OFFSET<0:1>) in response to the post enable signal (EN_POST), and thus output a detection signal (DET). The comparator 147 may compare a digital code value of the refresh detection signal (REF_T<0:N−1>) with a digital code value of an offset signal (OFFSET<0:1>) by synchronizing with activation of the post-enable signal (EN_POST), and thus output a detection signal (DET). In an embodiment, if a value of the refresh detection signal (REF_T<0:N−1>) is greater than a value the offset signal (OFFSET<0:1>) during an activation period of the post-enable signal (EN_POST), the comparator 147 is configured to output the detection signal (DET) at a first logic level. In an embodiment, if the value of the refresh detection signal (REF_T<0:N−1>) is less than the value of the offset signal (OFFSET<0:1>) during the activation period of the post-enable signal (EN_POST), the comparator 147 is configured to output the detection signal (DET) at a second logic level.

Figure 2:
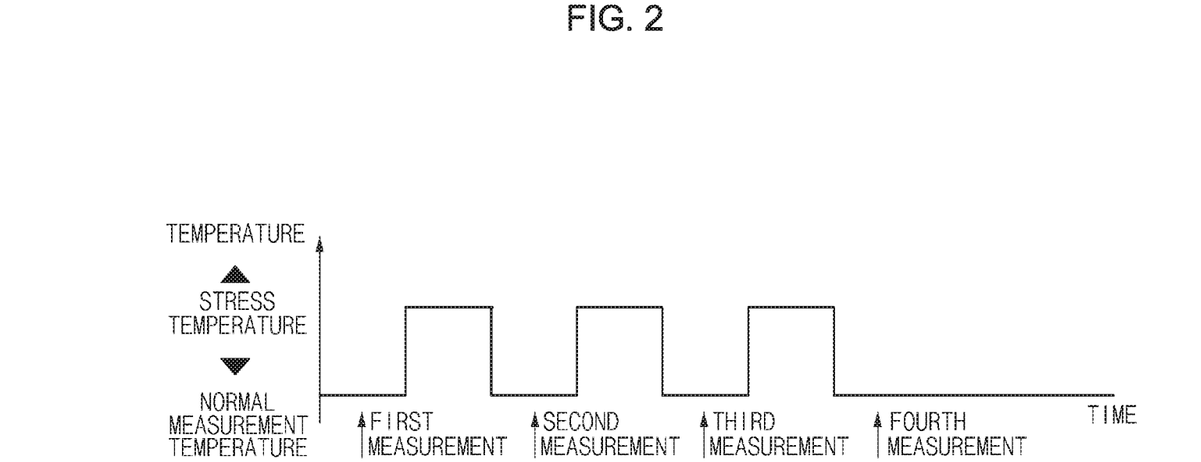
FIGS. 2 and 3 are timing diagrams illustrating representations of examples of the operations of the refresh time detection circuit according to an embodiment of the present disclosure.

FIG. 2 is a timing diagram illustrating the operations of the refresh time detection circuit 140 according to an embodiment of the present disclosure.

Referring to FIG. 2, the refresh time detection circuit 140 may measure a refresh time (tREF: Refresh Time, Data Retention Time) by applying a high-temperature stress according to a time variation. In other words, the refresh time (tREF) may be measured twice at a normal temperature, stress may be periodically applied at a higher temperature than the normal temperature, and the refresh time (tREF) may be re-measured two times, three times, or four times. As described above, the high-temperature stress is periodically applied to the semiconductor device, and the refresh time (tREF) is then measured several times.

The semiconductor device 100 may have unique characteristics in which a retention time of cell data is changed according to the stress temperature condition. The semiconductor device 100 may stably operate only when the retention time of cell data is maintained in a saturation state under high-temperature stress. The refresh time (tREF) may be measured according to a high-temperature stress application time period, such that it may be possible to detect the stress operation condition in which the cell data retention time has saturation characteristics. In an embodiment, the pre-enable signal (EN_PRE) is activated during a temperature stress application time period. In an embodiment, the post-enable signal (EN_POST) is activated after lapse of the temperature stress application time period.

Figure 3:
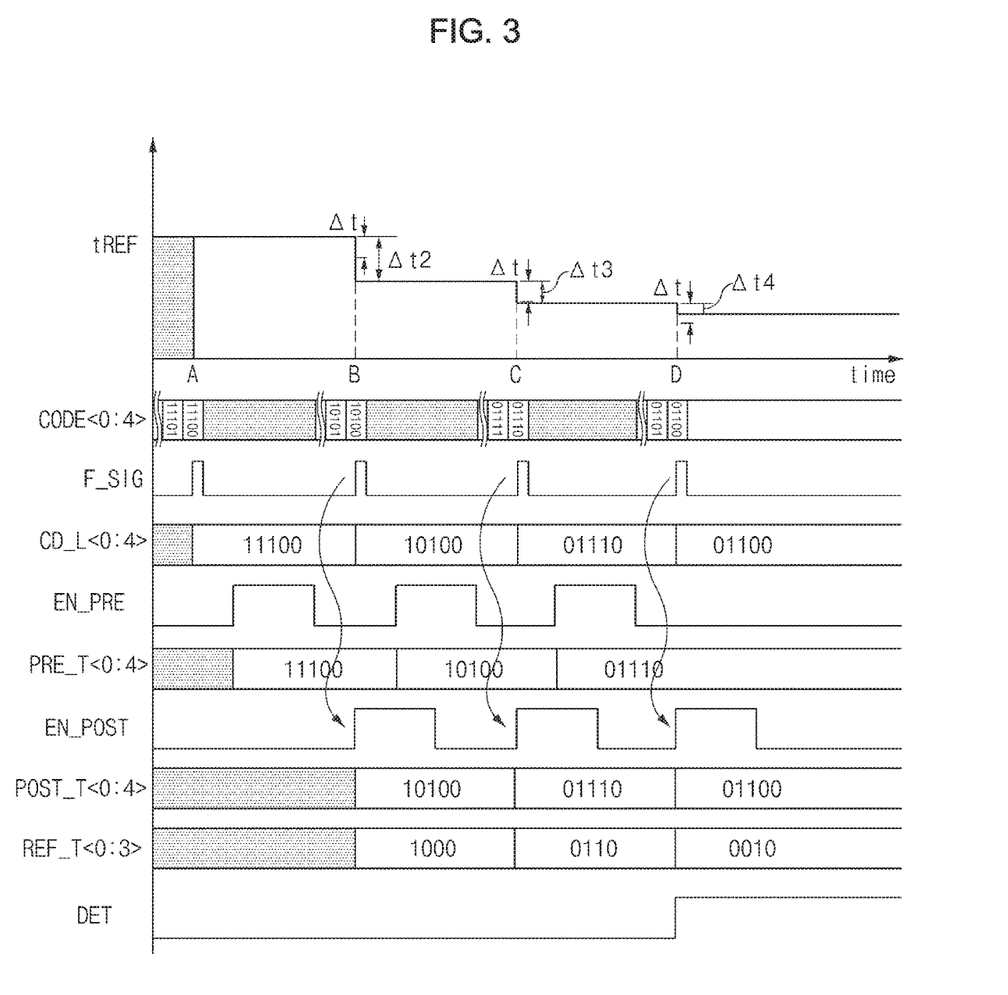

FIG. 3 is a timing diagram illustrating the operations of the refresh time detection circuit 140 according to an embodiment of the present disclosure.

Referring to FIG. 3, each of the code signals (CODE<0:4>), the latch signals (CD_L<0:4>), the pre-code signals (PRE_T<0:4>), and the post-code signals (POST_T<0:4>)

include 5-bit code values for convenience of description and better understanding of the present disclosure, but are not limited to 5-bit code values and more or less bits than 5-bits can be implemented according to the various embodiments. For example, the refresh detection signal (REF_T<0:3>) may include 4-bit code values, and the offset signal (OFFSET<0:1>) may include 2-bit values.

Referring to FIG. 3, the refresh time (tREF) may be measured at a first measurement time (A), and may be measured at a second measurement time (B). Subsequently, the refresh time (tREF) may be measured at a third measurement time (C), and may be measured at a fourth measurement time (D).

Referring to FIG. 3, the refresh time (tREF) is not reduced at the first measurement time (A). However, after the refresh time (tREF) is sequentially measured two times, three times, and four times, the refresh time (tREF) is gradually reduced. In other words, assuming that the offset value of the refresh time (tREF) is denoted by Δt, the refresh time (tREF) is not reduced at the measurement time (A). Here, Δt may be a value of the offset signal (OFFSET<0:1>) of FIG. 1.

The refresh time (tREF) may be reduced by Δt2 at the measurement time (B), and may be reduced by Δt3 at the measurement time (C). The refresh time (tREF) may be reduced by Δt4 at the measurement time (D), such that the resultant refresh time (tREF) may be less than the offset value Δt.

That is, high-temperature stress may be applied in a system mounting procedure after the semiconductor device package is manufactured. Retention characteristics of cell data are gradually reduced in proportion to the increasing number of test times, and the saturation state is achieved at the measurement time (D). Cell data retention characteristics must be maintained in the saturation state after the high-temperature stress is applied to the semiconductor device, resulting in stable operation. Therefore, embodiments of the present disclosure may measure the refresh time (tREF) changeable according to stress applied to the semiconductor device, may activate the detection signal (DET) at the saturation time point (D) at which the refresh time (tREF) is saturated, and may output the activated detection signal (DET) to the test device 1000. The test device 1000 may determine the screening direction in response to the detection signal (DET), and may establish a refresh period.

The code generator 141 may generate the code signal (CODE<0:N>) according to the command signal (CA) applied to the semiconductor device. The latch 143 may latch the code signal (CODE<0:N>) by synchronizing with the activation time of the fail signal (F_SIG), and may output the latch signal (CD_L<0:N>). In this case, the fail signal (F_SIG) may be generated whenever the external test device 1000 measures the refresh time (tREF) at each of the measurement times (A, B, C, D).

For example, if the fail signal (F_SIG) is activated at the measurement time (A), the latch 143 may latch the code signal (CODE<0:N>) denoted by "11100", and may thus output the latch signal (CD_L<0:N>) denoted by "11100". If the fail signal (F_SIG) is activated at the measurement time (B), the latch 143 may latch the code signal (CODE<0:N>) denoted by "10100", and may thus output the latch signal (CD_L<0:N>) denoted by "10100". In addition, assuming that the fail signal (F_SIG) is activated at the measurement time (C), the latch 143 may latch the code signal (CODE<0:N>) denoted by "01110", and may thus output the latch signal (CD_L<0:N>) denoted by "01110". If the fail signal (F_SIG) is activated at the measurement time (D), the latch 143 may latch the code signal (CODE<0:N>) denoted by "01100", and may thus output the latch signal (CD_L<0:N>) denoted by "01100".

Subsequently, assuming that the pre-enable signal (EN_PRE) is activated, the latch 144 may latch the latch signal (CD_L<0:N>), and may output the pre-code signal (PRE_T<0:N>). Here, the activation period of the pre-enable signal (EN_PRE) may correspond to the high-temperature stress reception period of FIG. 2. That is, the pre-enable signal (EN_PRE) may transition to a high level by synchronizing with a specific time at which a stress temperature of FIG. 2 is changed, and may transition to a low level by synchronizing with a specific time at which the stress temperature of FIG. 2 is deactivated to a normal measurement temperature.

The pre-enable signal (EN_PRE) may be enabled at a first activation time of the fail signal (F_SIG), and may be disabled at the other time (D) at which the refresh time (tREF) is less than the offset value Δt.

For example, assuming that the pre-enable signal (EN_PRE) is activated after lapse of the measurement time (A), the latch 144 may latch the latch signal (CD_L<0:N>) denoted by "11100", and may output the pre-code signal (PRE_T<0:N>) denoted by "11100".

If the pre-enable signal (EN_PRE) is activated after lapse of the next measurement time (B), the latch 144 may latch the latch signal (CD_L<0:N>) denoted by "10100", and may output the pre-code signal (PRE_T<0:N>) denoted by "10100". Subsequently, if the pre-enable signal (EN_PRE) is activated after lapse of the measurement time (C), the latch 144 may latch the latch signal (CD_L<0:N>) denoted by "01110", and may thus output the pre-code signal (PRE_T<0:N> denoted by "01110". In this case, the refresh time (tREF) is denoted by Δt4 at the measurement time (D) so that the resultant refresh time (tREF) is less than the offset value Δt. As a result, the pre-enable signal (EN_PRE) is no longer activated.

Thereafter, if the post-enable signal (EN_POST) is activated, the latch 145 may latch the latch signal (CD_L<0:N>), and may output the post-code signal (POST_T<0:N>). The post-enable signal (EN_POST) may be generated in response to the fail signal (F_SIG). Since no stress is applied to the semiconductor device at the first activation time (A) of the fail signal (F_SIG), the post-enable signal (EN_POST) is disabled. That is, the post-enable signal (EN_POST) may be activated by synchronizing with the second activation time (B) of the fail signal (F_SIG).

For example, if the post-enable signal (EN_POST) is activated at the time point (B), the latch 145 may latch the latch signal (CD_L<0:N>) denoted by "10100", and may thus output the code signal (POST_T<0:N>) denoted by "10100". Subsequently, if the post-enable signal (EN_POST) is activated at the time point (C), the latch 145 may latch the latch signal (CD_L<0:N>) denoted by "01110", and may output the post-code signal (POST_T<0:N>) denoted by "01110". Subsequently, if the post-enable signal (EN_POST) is activated at the time point (D), the latch 145 may latch the latch signal (CD_L<0:N>) denoted by "01100", and may output the post-code signal (POST_T<0:N>) denoted by "01100".

Thereafter, the subtractor 146 may perform subtraction between the pre-code signal (PRE_T<0:N>) and the post-code signal (POST_T<0:N>), and may thus output the refresh detection signal (REF_T<0:N−1>).

For example, the subtractor 146 may perform subtraction between the pre-code signal (PRE_T<0:N>) denoted by "11100" and the post-code signal (POST_T<0:N>) denoted by "10100", and may thus the refresh detection signal (REF_T<0:N−1>) denoted by "1000". Thereafter, the subtractor 146 may perform subtraction between the pre-code signal (PRE_T<0:N>) denoted by "10100" and the post-code signal (POST_T<0:N>) denoted by "01110", and may thus output the refresh detection signal (REF_T<0:N−1>) denoted by "0110".

Subsequently, the subtractor 146 may perform subtraction between the pre-code signal (PRE_T<0:N>) denoted by "01110" and the post-code signal (POST_T<0:N>) denoted by "01100", and may thus the refresh detection signal (REF_T<0:N−1>) denoted by "0010".

Subsequently, the comparator 147 may compare the refresh detection signal (REF_T<0:N−1>) with the offset signal (OFFSET<0:1>) by synchronizing with the post-enable signal (EN_POST), and may thus output the detection signal (DET). That is, assuming that the refresh detection signal (REF_T<0:N−1>) is higher than the offset signal (OFFSET<0:1>) during activation of the post-enable signal (EN_POST), the comparator 147 may deactivate the detection signal (DET). Assuming that the refresh detection signal (REF_T<0:N−1>) is less than the offset signal OFFSET<0:1> during activation of the post-enable signal (EN_POST), the comparator 147 may activate the detection signal (DET).

For example, it is assumed that the offset signal (OFFSET<0:1>) is denoted by "11". As a result, assuming that the refresh detection signal (REF_T<0:N−1>) denoted by "1000" or "0110" is applied to the comparator 147 so that the refresh detection signal (REF_T<0:N−1>) is higher than the offset signal OFFSET<0:1> denoted by "11", the comparator 1147 may deactivate the detection signal (DET) to a logic low level. In contrast, assuming that the refresh detection signal (REF_T<0:N−1>) denoted by "0010" is applied to the comparator 147 so that the refresh detection signal (REF_T<0:N−1>) is less than the offset signal OFFSET<0:1> denoted by "11", the comparator 147 may activate the detection signal (DET) to a logic high level. Further, the logic levels of the signals may be different from or the opposite of those described. For example, a signal described as having a logic "high" level may alternatively have a logic "low" level, and a signal described as having a logic "low" level may alternatively have a logic "high" level.

If the detection signal (DET) having a logic high level is applied to the external test device 1000, a temperature stress sequence is stopped and the test is completed. Therefore, the external test device 1000 may detect a stress temperature condition having the optimum refresh time (tREF) upon receiving the detection signal (DET) from the refresh time detection circuit 140, such that the external test device 1000 can prevent excessive stress from being applied to the semiconductor device 100 during the test operation of the semiconductor device 100, resulting in prevention of product reliability deterioration.

Embodiments of the present disclosure may minimize a variation in data retention time characteristics in association with the temperature stress during the system mounting process after the products are manufactured, such that durability of the data retention time characteristics can be improved.

Figure 4:
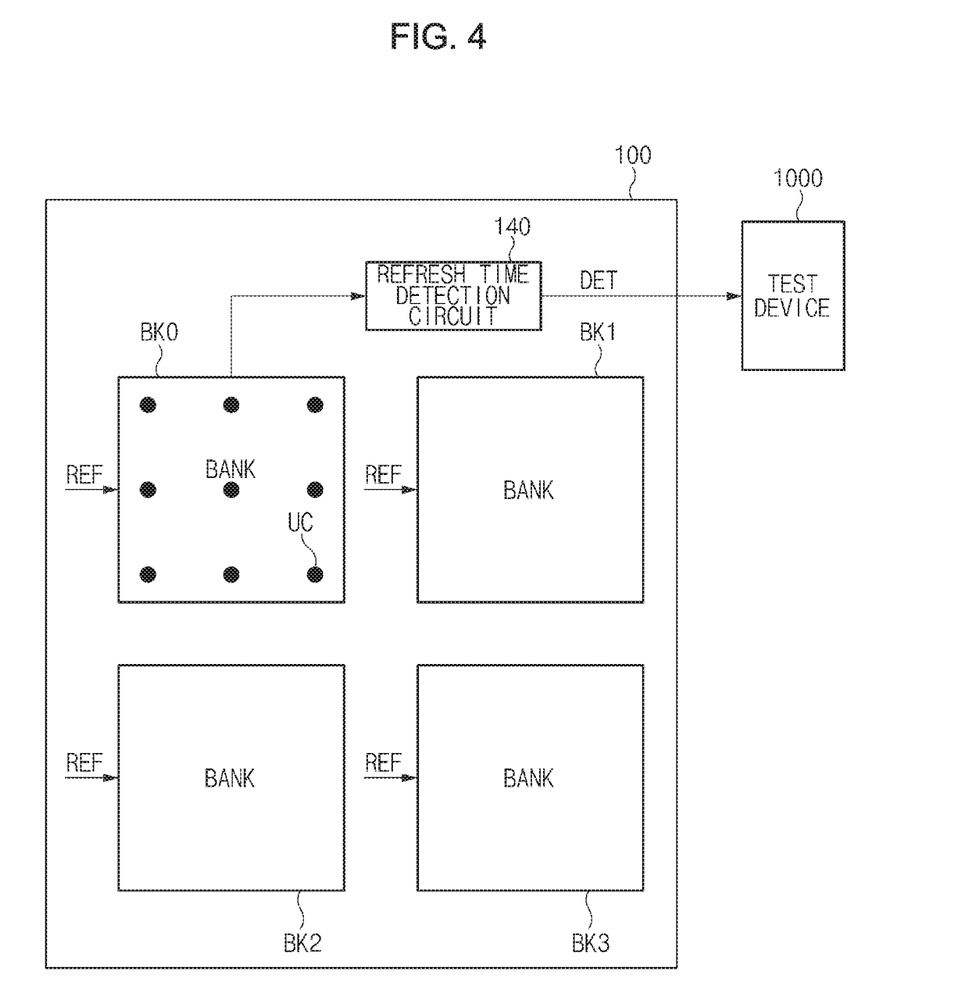
FIG. 4 is a block diagram illustrating a representation of an example of a semiconductor device to which the refresh time detection circuit of FIG. 1 is applied.

FIG. 4 is a block diagram illustrating a semiconductor device to which the refresh time detection circuit 140 illustrated in FIG. 1 is applied.

Referring to FIG. 4, the semiconductor device 100 may include the plurality of banks (BK0~BK3) and the refresh time detection circuit 140. During the test mode of the semiconductor device 100, the test for the refresh time (tREF) may be carried out according to the test device 1000.

The refresh time detection circuit 140 may detect the refresh time as illustrated in FIGS. 1 to 3. The refresh operations for the respective banks (BK0~BK3) may bee controlled according to the refresh signal (REF).

The semiconductor memory device such as a DRAM may be configured to write data therein according to electric charges stored in a capacitor contained in each cell. Electric charges of the capacitor contained in the cell may be configured in the form of a leakage current and may leak outside the cell according to lapse of time. In order to prevent loss of data caused by a leakage current, before data stored in the cell is completely damaged or lost, data needs to be retrieved from the cell, read, and re-written in the cell.

The above-mentioned operation is referred to as a refresh operation, and may be carried out at intervals of a predetermined time or upon receiving a request from the system. There may be a difference in retention capability (i.e., data retention time) of each capacitor contained in the cell.

The refresh operation may be carried out whenever the refresh signal (REF) is transferred from a memory controller (not illustrated) to the respective banks (BK0~BK3). The memory controller may periodically output a refresh command to the memory in consideration of the data retention time of the memory.

The refresh time detection circuit 140 may select an arbitrary unit cell (UC) from among the respective unit cells (UCs) contained in the respective banks (BK0~BK3), and may detect the refresh time (tREF). In this case, the refresh time (tREF) may be controlled in different ways by adjusting the number of refresh times per bank (BK0, BK1, BK2, or BK3).

Although the embodiments of the present disclosure have, for example, disclosed that the refresh time (tREF) of the unit cell (UC) contained in the first bank BK0 is detected for convenience of description, the refresh time (tREF) of the unit cell (UC) of the other banks (BK1~BK3) may also be detected. The refresh time detection circuit 140 may generate a detection signal (DET), and may output the detection signal (DET) to the external test device 1000.

As is apparent from the above description, the refresh time detection circuit and the semiconductor device including the same according to an embodiment, which can detect a refresh time variation according to a stress temperature condition to reduce a variation in refresh time characteristics.

The semiconductor devices and refresh time detection circuits as discussed above (see FIGS. 1-4) are particular useful in the design of other memory devices, processors, and computer systems. For example, referring to FIG. 5, a block diagram of a system employing a semiconductor device and or refresh time detection circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 5:
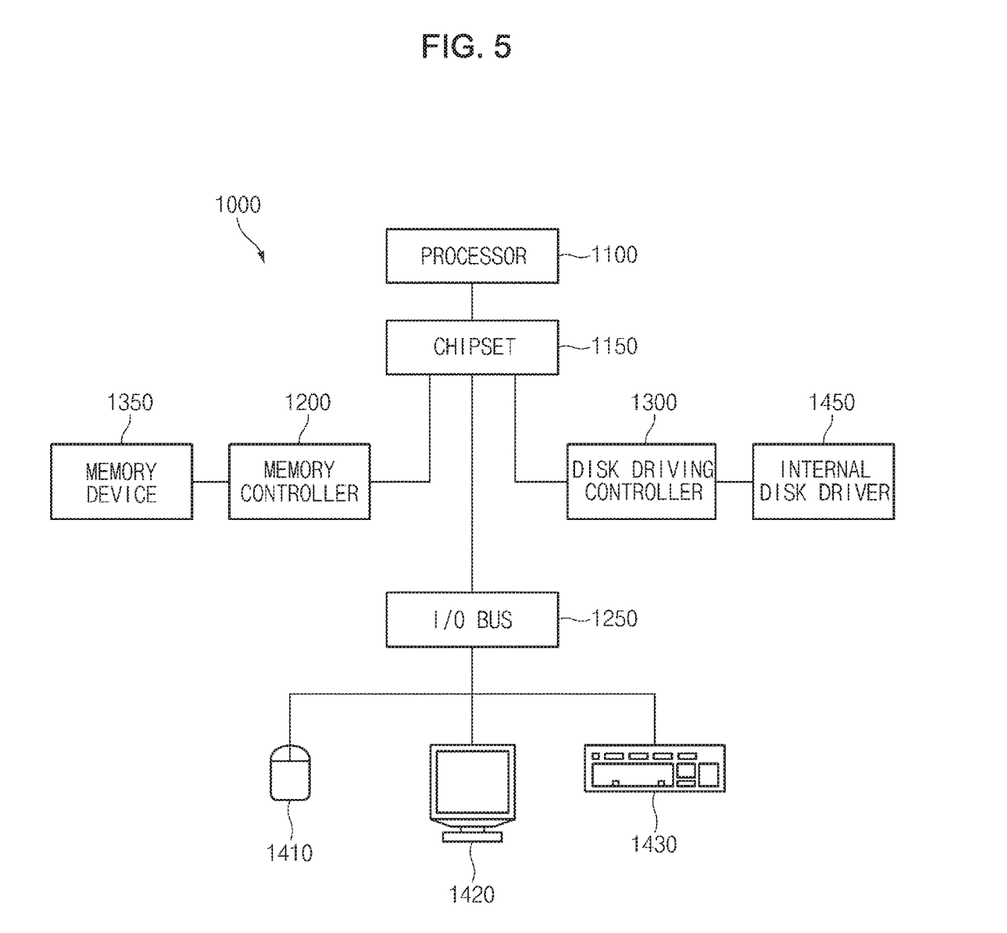
FIG. 5 illustrates a block diagram of an example of a representation of a system employing a semiconductor device and or a refresh time detection circuit with the various embodiments discussed above with relation to FIGS. 1-4.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driving controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and or refresh time detection circuit as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and or refresh time detection circuit as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driving controller 1300 may be operably coupled to the chipset 1150. The disk driving controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driving controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a semiconductor device and or refresh time detection circuit as discussed above with relation to FIGS. 1-4. In alternate embodiments, such as, for example but not limited to, cellular phones or digital cameras, the components may differ from the embodiments illustrated in FIG. 5.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the disclosure or included as a new claim by a subsequent amendment after the application is filed.

Although a number of illustrative embodiments consistent with the description have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A refresh time detection circuit comprising:
   a code generator configured to generate a code signal for detecting a refresh time;
   a latch circuit configured to generate a latch signal by latching the code signal according to a fail signal, and generate a pre-code signal and a post-code signal by latching each latch signal according to a pre-enable signal and a post-enable signal;
   a subtractor configured to output a refresh detection signal by performing subtraction between the pre-code signal and the post-code signal; and
   a comparator configured to generate a detection signal by comparing the refresh detection signal with an offset signal based on activation of the post-enable signal.

2. The refresh time detection circuit according to claim 1, wherein the code generator is configured to sequentially generate a plurality of code signals,
   wherein the code generator is configured to sequentially increase a value of the code signal based on a command signal.

3. The refresh time detection circuit according to claim 1, wherein the latch circuit includes:
   a first latch configured to latch the code signal by synchronizing with the fail signal, and generate the latch signal;
   a second latch configured to output the pre-code signal by latching the latch signal based on the pre-enable signal; and
   a third latch configured to generate the post-code signal by latching the latch signal based on the post-enable signal.

4. The refresh time detection circuit according to claim 1, wherein:
   if a value of the refresh detection signal is greater than a value of the offset signal during an activation period of the post-enable signal, the comparator is configured to output the detection signal at a first logic level; and
   if a value of the refresh detection signal is less than a value of the offset signal during the activation period of the post-enable signal, the comparator is configured to output the detection signal at a second logic level.

5. The refresh time detection circuit according to claim 1, wherein the fail signal includes specific information in which refresh data is maintained or lost when the refresh time is changed.

6. The refresh time detection circuit according to claim 1, wherein the pre-enable signal is activated during a temperature stress application time period.

7. The refresh time detection circuit according to claim 1, wherein the post-enable signal is generated by synchronizing with the fail signal.

8. The refresh time detection circuit according to claim 7, wherein the post-enable signal is activated after lapse of the temperature stress application time period.

9. The refresh time detection circuit according to claim 7, wherein the post-enable signal is generated by synchronizing with a second activation period of the fail signal after a first activation period of the fail signal.

10. A semiconductor device comprising:
a first input buffer configured to buffer a command signal received from an external test device;
a refresh time detection circuit configured to latch a code signal corresponding to an output signal of the first input buffer according to a fail signal, a pre-enable signal, and a post-enable signal, generate a pre-code signal and a post-code signal activated at different times, and output a detection signal by comparing a refresh detection signal obtained by subtraction between the pre-code signal and the post-code signal with an offset signal; and
an output buffer configured to buffer the detection signal, and output the buffered detection signal to the external test device.

11. The semiconductor device according to claim 10, wherein the refresh time detection circuit includes:
a code generator configured to generate the code signal for detecting a refresh time;
a latch circuit configured to generate a latch signal by latching the code signal according to the fail signal, and generate the pre-code signal and the post-code signal by latching each latch signal according to the pre-enable signal and the post-enable signal;
a subtractor configured to output the refresh detection signal by performing subtraction between the pre-code signal and the post-code signal; and
a comparator configured to generate the detection signal by comparing the refresh detection signal with the offset signal based on activation of the post-enable signal.

12. The semiconductor device according to claim 11, wherein the code generator is configured to sequentially generate a plurality of code signals, wherein the code generator is configured to sequentially increase a value of the code signal based on the command signal.

13. The semiconductor device according to claim 11, wherein the latch circuit includes:
a first latch configured to latch the code signal by synchronizing with the fail signal, and generate the latch signal;
a second latch configured to output the pre-code signal by latching the latch signal based on the pre-enable signal; and
a third latch configured to generate the post-code signal by latching the latch signal based on the post-enable signal.

14. The semiconductor device according to claim 11, wherein:
if a value of the refresh detection signal is greater than a value of the offset signal during an activation period of the post-enable signal, the comparator is configured to output the detection signal at a first logic level; and
if a value of the refresh detection signal is less than a value of the offset signal during the activation period of the post-enable signal, the comparator is configured to output the detection signal at a second logic level.

15. The semiconductor device according to claim 11, wherein the fail signal includes specific information in which refresh data is maintained or lost when the refresh time is changed.

16. The semiconductor device according to claim 11, wherein the pre-enable signal is activated during a temperature stress applying time period.

17. The semiconductor device according to claim 11, wherein the post-enable signal is generated by synchronizing with the fail signal.

18. The semiconductor device according to claim 17, wherein the post-enable signal is activated after lapse of the temperature stress applying time period.

19. The semiconductor device according to claim 10, further comprising:
a second input buffer configured to buffer the fail signal, and output the buffered fail signal to the refresh time detection circuit.

20. The semiconductor device according to claim 10, wherein the refresh time detection circuit is coupled to a plurality of banks to detect a refresh time for each bank.

* * * * *